(12) United States Patent
Tanaka et al.

(10) Patent No.: US 10,548,092 B2
(45) Date of Patent: Jan. 28, 2020

(54) HIGH-FREQUENCY SIGNAL PROCESSING APPARATUS AND WIRELESS COMMUNICATION APPARATUS

(71) Applicant: Murata Manufacturing Co., Ltd., Kyoto (JP)

(72) Inventors: Satoshi Tanaka, Kyoto (JP); Kiichiro Takenaka, Kyoto (JP); Takayuki Tsutsui, Kyoto (JP); Taizo Yamawaki, Kyoto (JP); Shun Imai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/243,634

(22) Filed: Jan. 9, 2019

(65) Prior Publication Data

US 2019/0150100 A1 May 16, 2019

Related U.S. Application Data

(63) Continuation of application No. 15/924,861, filed on Mar. 19, 2018, now Pat. No. 10,212,671, which is a (Continued)

(30) Foreign Application Priority Data

Dec. 28, 2011 (JP) .................................. 2011-287648

(51) Int. Cl.
*H04W 52/24* (2009.01)
*H04W 52/02* (2009.01)
(Continued)

(52) U.S. Cl.
CPC ........ *H04W 52/246* (2013.01); *H03F 1/0216* (2013.01); *H03F 1/0227* (2013.01);
(Continued)

(58) Field of Classification Search
CPC ............................ H04W 52/246; H04W 88/06
See application file for complete search history.

(56) References Cited

U.S. PATENT DOCUMENTS 6,157,253 A 12/2000 Sigmon
8,478,213 B2 7/2013 Muhammad
(Continued)

FOREIGN PATENT DOCUMENTS

JP 10-284947 A 10/1998
JP 2004-104194 A 4/2004
(Continued)

OTHER PUBLICATIONS

International Search Report issued in Application No. PCT/JP2012/081535 dated Mar. 5, 2013.
(Continued)

*Primary Examiner* — Keith Ferguson
(74) *Attorney, Agent, or Firm* — Pearne & Gordon LLP

(57) ABSTRACT

A high-frequency signal processing apparatus and a wireless communication apparatus can achieve a decrease in power consumption. For example, when an indicated power level to a high-frequency power amplifier is equal to or greater than a second reference value, envelope tracking is performed by causing a source voltage control circuit to control a high-speed DCDC converter using a detection result of an envelope detecting circuit and causing a bias control circuit to indicate a fixed bias value. The source voltage control circuit and the bias control circuit indicate a source voltage and a bias value decreasing in proportion to a decrease in the indicated power level when the indicated power level is in a range of the second reference value to the first reference value, and indicate a fixed source voltage and a fixed bias value when the indicated power level is less than the first reference value.

5 Claims, 13 Drawing Sheets

Related U.S. Application Data continuation of application No. 15/720,188, filed on Sep. 29, 2017, now Pat. No. 9,955,435, which is a continuation of application No. 15/598,608, filed on May 18, 2017, now Pat. No. 9,807,703, which is a continuation of application No. 15/403,507, filed on Jan. 11, 2017, now Pat. No. 9,693,320, which is a continuation of application No. 15/241,991, filed on Aug. 19, 2016, now Pat. No. 9,585,105, which is a continuation of application No. 14/369,216, filed as application No. PCT/JP2012/081535 on Dec. 5, 2012, now Pat. No. 9,451,561.

(51) Int. Cl.
| | |
|---|---|
| *H03F 3/189* | (2006.01) |
| *H03F 3/24* | (2006.01) |
| *H04B 1/04* | (2006.01) |
| *H03F 1/02* | (2006.01) |
| *H03F 3/19* | (2006.01) |
| *H03F 3/21* | (2006.01) |
| *H04W 88/06* | (2009.01) |

(52) U.S. Cl.
CPC ........... *H03F 1/0277* (2013.01); *H03F 3/189* (2013.01); *H03F 3/19* (2013.01); *H03F 3/21* (2013.01); *H03F 3/24* (2013.01); *H04B 1/0475* (2013.01); *H04W 52/0251* (2013.01); *H04W 52/0261* (2013.01); *H03F 2200/102* (2013.01); *H03F 2200/294* (2013.01); *H03F 2200/504* (2013.01); *H04W 88/06* (2013.01); *Y02D 70/00* (2018.01); *Y02D 70/1246* (2018.01); *Y02D 70/1262* (2018.01); *Y02D 70/40* (2018.01)

(56) References Cited

U.S. PATENT DOCUMENTS

| | | |
|---|---|---|
| 9,042,848 B2 | 5/2015 | Collados Asensio |
| 2004/0263246 A1 | 12/2004 | Robinson |
| 2005/0135502 A1 | 6/2005 | Zhang et al. |
| 2007/0183530 A1 | 8/2007 | Udagawa |
| 2011/0151806 A1* | 6/2011 | Kenington ............... H01Q 3/28 455/101 |
| 2011/0183636 A1 | 7/2011 | Staudinger et al. |
| 2012/0161878 A1* | 6/2012 | Joly ...................... H03F 1/0211 330/296 |

FOREIGN PATENT DOCUMENTS

| | | |
|---|---|---|
| JP | 2005-020383 A | 1/2005 |
| JP | 2005-020694 A | 1/2005 |
| JP | 2005-295533 A | 10/2005 |

OTHER PUBLICATIONS

Translation of Written Opinion issued in Application No. PCT/JP2012/081535 dated Mar. 5, 2013.

* cited by examiner

CONSTANT VDD OPERATION

ENVELOPE TRACKING OPERATION

HIGH-FREQUENCY SIGNAL PROCESSING APPARATUS AND WIRELESS COMMUNICATION APPARATUS

This is a continuation U.S. patent application Ser. No. 15/924,861 filed Mar. 19, 2018, which is a continuation of U.S. patent application Ser. No. 15/720,188, filed on Sep. 29, 2017, which is a continuation of U.S. patent application Ser. No. 15/598,608, filed on May 18, 2017, which is a continuation of U.S. patent application Ser. No. 15/403,507, filed on Jan. 11, 2017, which is a continuation of U.S. patent application Ser. No. 15/241,991, filed on Aug. 19, 2016, which is a continuation of U.S. patent application Ser. No. 14/369,216, filed on Jul. 30, 2014 which is a 371 of an International Application No. PCT/JP2012/081535 filed on Dec. 5, 2012, which claims priority from Japanese Patent Application No. 2011-287648 filed on Dec. 28, 2011. The contents of these applications are incorporated herein by reference in their entireties.

TECHNICAL FIELD

The present invention relates to a high-frequency signal processing apparatus and a wireless communication apparatus, and more particularly, to a technique which can be effectively applied to a wireless communication apparatus for a mobile phone and a high-frequency signal processing apparatus constituting a part thereof.

BACKGROUND

For example, Patent Document 1 discloses a wireless communication apparatus that amplifies power using an envelope elimination and restoration (EER) mode when output power is equal to or greater than a predetermined value and that amplifies power using a linear mode when the output power is less than the predetermined value.

CITATION LIST

Patent Document

Patent Document 1: Japanese Patent No. 3979237

BRIEF SUMMARY OF THE INVENTION

Recently, a wireless communication apparatus such as a mobile phone has requested for a reduction in talk current in addition to a decrease in size. The talk current indicates an integrated value of a probability distribution of frequency of use of output power levels at the time of transmission and current consumption of a high-frequency power amplifying unit at the respective output power levels. By reducing the talk current, it is possible to reduce power consumption of a mobile phone or the like and to extend a lifetime of a battery. FIG. 9 is a diagram illustrating an example of a probability distribution of frequency of use of output power levels in a mobile phone for wideband-code division multiple access (W-CDMA). As illustrated in FIG. 9, low power levels around 0 dBm are often used in a mobile phone for W-CDMA. Accordingly, improvement in power added efficiency (PAE) of a high-frequency power amplifying unit at the low power levels is advantageous for reducing a talk current (power consumption).

Here, as means for improving the power added efficiency (PAE), for example, it can be considered to use an envelope tracking mode. FIG. 10 is a block diagram illustrating a schematic configuration example of a high-frequency power amplifying unit in a wireless communication apparatus employing the envelope tracking mode which has been studied as the premise of the present invention. FIG. 11B is an explanatory diagram illustrating an operation example of the envelope tracking mode in FIG. 10, and FIG. 11A is an explanatory diagram illustrating an operation example of a linear mode as a comparative example. As illustrated in FIG. 10, implementation of the envelope tracking mode requires a high-frequency power amplifier HPA, an amplitude detecting circuit (envelope detecting circuit) ADETC' that detects an amplitude modulated component (envelope) included in an input power signal Pin of the high-frequency power amplifier HPA, and a high-speed DC-DC converter DCDC that generates a source voltage VDD tracking the envelope.

FIG. 11A illustrates an operation example when the envelope tracking mode is not used and a source voltage VDD is set to a fixed value. The value of the source voltage VDD is set so that the maximum output voltage amplitude of the high-frequency power amplifier HPA maintains the minimum linear operation voltage Vk of an output transistor or greater. The minimum linear operation voltage Vk is called knee voltage or the like. When the output voltage amplitude of the high-frequency power amplifier HPA reaches an area less than the minimum linear operation voltage Vk, the operation area of the transistor enters a triode area (an unsaturated area in an FET) or the like and thus a linear amplification operation is not guaranteed. Here, when the source voltage VDD is set to a fixed value and the output voltage amplitude (signal amplitude of a modulation signal) of the high-frequency power amplifier HPA becomes smaller than the maximum amplitude (Amax in the drawing), as can be seen from FIG. 11A, the value of the source voltage VDD unnecessarily increases. As a result, loss of DC power may occur as indicated by a hatched part in FIG. 11A.

On the other hand, when the envelope tracking mode is used along with the configuration illustrated in FIG. 10, the source voltage VDD of the high-frequency power amplifier HPA is controlled so as to track the modulation amplitude as illustrated in FIG. 11B. In this case, the lowest voltage of the output voltage amplitude (signal amplitude of a modulation signal) of the high-frequency power amplifier HPA is maintained almost at the minimum linear operation voltage Vk regardless of the magnitude of the signal amplitude varying in time series. As a result, it is possible to suppress the factor for loss of DC power which has been a problem in FIG. 11A. When the envelope tracking mode is used, an average source voltage in the case of W-CDMA, for example, can be decreased by about 3.5 dB to 4 dB. As a result, the power consumption can be ideally reduced by about 35% to 40%. When the efficiency of a high-speed DCDC converter DCDC is set to 80%, the efficiency of the high-frequency power amplifier HPA is also affected, but efficiency improvement of about 15% in the whole high-frequency power amplifying unit can be expected.

Actually, when the output power (output voltage amplitude) of the high-frequency power amplifier HPA decreases and becomes a certain value or less, it may be difficult to obtain a decrease in power consumption due to the envelope tracking mode. That is, for example, when the output voltage amplitude is sufficiently small with reference to FIG. 11A and when the envelope tracking mode is not used but the source voltage VDD is fixed to a certain lower value, great loss does not occur. When the envelope tracking mode is used in this state, the power consumption of the high-speed DCDC converter DCDC due to the envelope tracking is dominant and thus a decrease in power consumption may not be achieved. When the output voltage amplitude decreases, the accuracy with which the source voltage VDD is controlled by the high-speed DCDC converter DCDC may be a problem. Therefore, it can be considered, for example, using Patent Document 1 that an amplifying operation is performed using a linear mode in a state where the source voltage is set to a fixed value when the output voltage amplitude decreases by a certain degree.

However, as illustrated in FIG. 9, low power levels around 0 dBm are often used, for example, in W-CDMA or the like. The envelope tracking mode is a technique useful when the output power level is high to a certain degree as described above and may not achieve an advantageous effect at such low power levels. Therefore, it can be considered that a linear mode in a state where the source voltage VDD is set to a fixed value is used at the low power levels, but it is difficult to obtain an excellent effect of a decrease in power consumption with this mode. In order to obtain a great effect of a decrease in power consumption in a mobile phone in actual use, a design at the low power levels is particularly important.

Embodiments to be described below are made in consideration of such circumstances and an object thereof is to provide a high-frequency signal processing apparatus which can achieve a decrease in power consumption and a wireless communication apparatus having the same. The object, other objects, and novel features of the present invention will become apparent from the following detailed description and the attached drawings.

Summary of representative means for solving the problems disclosed in this description will be described below in brief as follows.

A wireless communication apparatus according to an embodiment of the present invention includes a power amplifying circuit, a source voltage generating circuit configured to supply a source voltage to the power amplifying circuit, a bias control circuit configured to control a bias of the power amplifying circuit, and first and second operation modes. The source voltage generating circuit is configured to generate the source voltage increasing in proportion to an increase of the indicated power level with respect to the power amplifying circuit in the second operation mode, and generate the fixed source voltage in the first operation mode. The bias control circuit controls the power amplifying circuit so as to supply the bias increasing in proportion to the increase of the indicated power level in the second operation mode, and control the power amplifying circuit so as to supply the fixed bias in the first operation mode. The second operation mode is performed when the indicated power level is equal to or greater than a first reference value, and the first operation mode is performed when the indicated power level is smaller than the first reference value.

By employing the wireless communication apparatus according to the embodiment described above, it is possible to decrease power consumption.

DETAILED DESCRIPTION OF THE DRAWINGS

Figure 1:
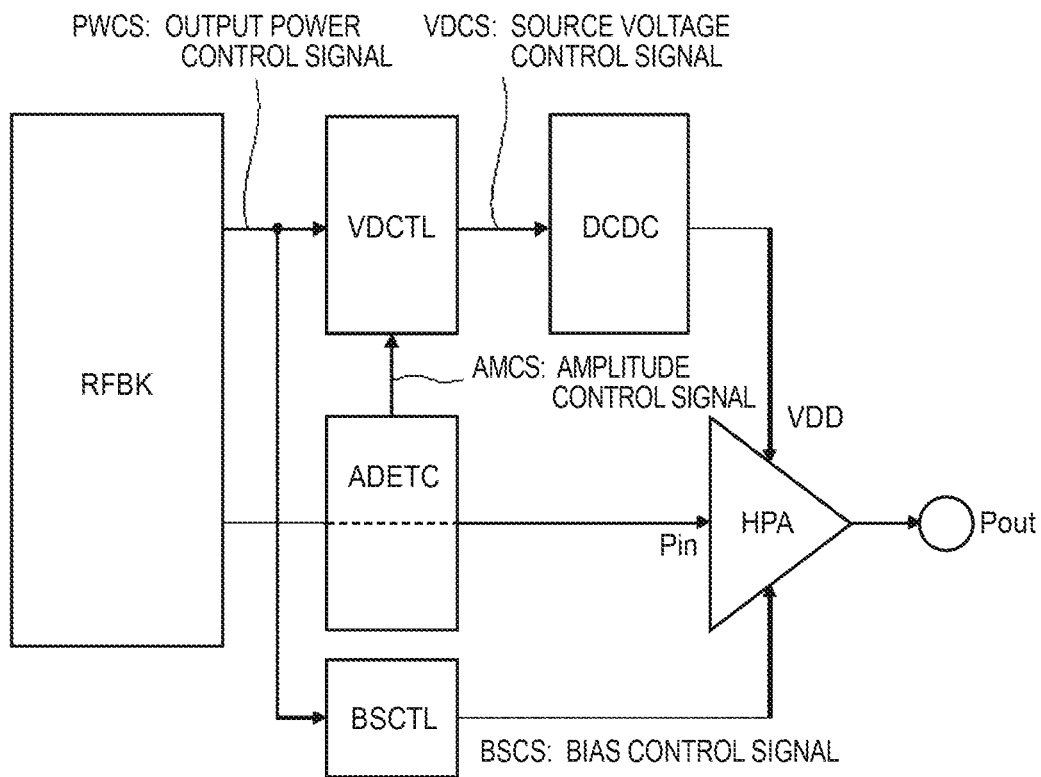
FIG. 1 is a block diagram illustrating a schematic configuration example of principal parts of a wireless communication apparatus according to Embodiment 1 of the present invention.

The following embodiment will be partitioned into plural sections or embodiments for description if necessary for convenience, but the sections or embodiments are irrelevant to each other as long as it is not otherwise explicitly mentioned. One has relations of modifications, details, supplemental explanation, and the like of all or a part with the other. In the following embodiment, when the number of elements and the like (including the number, the numerical value, the amount, and the range thereof) are mentioned, the number is not limited to a specific number but may be equal to or greater or less than the specific number as long as it is not explicitly mentioned differently and it is not clearly limited to the specific number in principle.

In the following embodiment, elements (including element steps) are not essential as long as it is not explicitly mentioned differently and it is not clearly considered to be essential. Similarly, in the following embodiment, when shapes and positional relationships of elements are mentioned, the mentioned shapes and positional relationships include shapes substantially approximating or similar to the shapes as long as it is not explicitly mentioned differently and it is not clear in principle. This is true of the numerical values and the ranges.

In the following embodiment, a metal oxide semiconductor field effect transistor (hereinafter, abbreviated to MOS transistor) is used as an insulator of a metal insulator semiconductor field effect transistor (hereinafter, abbreviated to MIS transistor), but a non-oxide film is not excluded as a gate insulating film. In the drawings, connection of a substrate potential of a MOS transistor is not particularly illustrated, but the connection method is not particularly limited as long as the MOS transistor can operate normally.

Hereinafter, embodiments of the present invention will be described with reference to the accompanying drawings. In the drawings illustrating the embodiments, the same elements are referenced by the same reference signs in principle and description thereof will not be repeated.

Embodiment 1

<Schematic Configuration of Principal Parts of Wireless Communication Apparatus>

Figure 10:
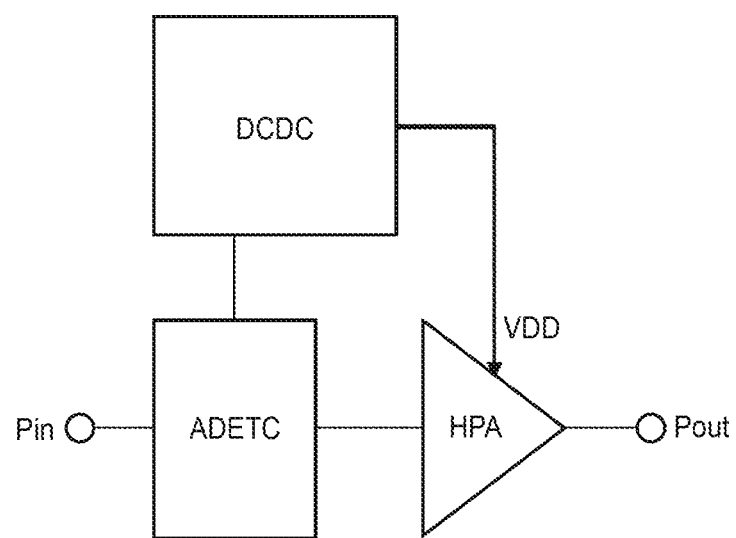
FIG. 10 is a block diagram illustrating a schematic configuration example of a high-frequency power amplifying unit in a wireless communication apparatus employing an envelope tracking mode which has been studied as the premise of the present invention.

FIG. 1 is a block diagram illustrating a schematic configuration example of principal parts in a wireless communication apparatus according to Embodiment 1 of the present invention. The wireless communication apparatus illustrated in FIG. 1 includes a high-frequency signal processing unit RFBK, an amplitude detecting circuit (envelope detecting circuit) ADETC, a source voltage control circuit VDCTL, a bias control circuit BSCTL, a high-speed DC-DC converter DCDC, and a high-frequency power amplifier HPA. Compared with FIG. 10, the configuration example illustrated in FIG. 1 further illustrates the source voltage control circuit VDCTL and the bias control circuit BSCTL.

The high-frequency signal processing unit RFBK performs a process of converting (up-converting) a baseband signal into a high-frequency signal having a predetermined frequency band and outputs the high-frequency signal as an input power signal Pin to the high-frequency power amplifier HPA via the amplitude detecting circuit ADETC. The high-frequency signal processing unit RFBK outputs an output power control signal PWCS to the source voltage control circuit VDCTL and the bias control circuit BSCTL. The output power control signal PWCS is a signal for setting the average value of output power levels (Pout) of the high-frequency power amplifier HPA and is a signal generated, for example, on the basis of indicated power from a baseband unit not illustrated.

The amplitude detecting circuit (envelope detecting circuit) ADETC detects the amplitude (envelope) of the input power signal Pin output from the high-frequency signal processing unit RFBK and outputs the detection result as an amplitude control signal (envelope detection signal) AMCS to the source voltage control circuit VDCTL. Although the details thereof will be described later, the source voltage control circuit VDCTL generates a source voltage control signal VDCS on the basis of the output power control signal PWCS and the amplitude control signal (envelope detection signal) AMCS. The high-speed DC-DC converter DCDC generates a source voltage VDD based on the source voltage control signal VDCS and supplies the source voltage VDD to the high-frequency power amplifier HPA. Although the details thereof will be described later, the bias control circuit BSCTL generates a bias control signal BSCS on the basis of the output power control signal PWCS. The high-frequency power amplifier HPA amplifies the power of the input power signal Pin using a bias based on the source voltage VDD and the bias control signal BSCS and outputs the output power signal Pout.

<Schematic Operation of Principal Parts of Wireless Communication Apparatus>

Figure 2A:
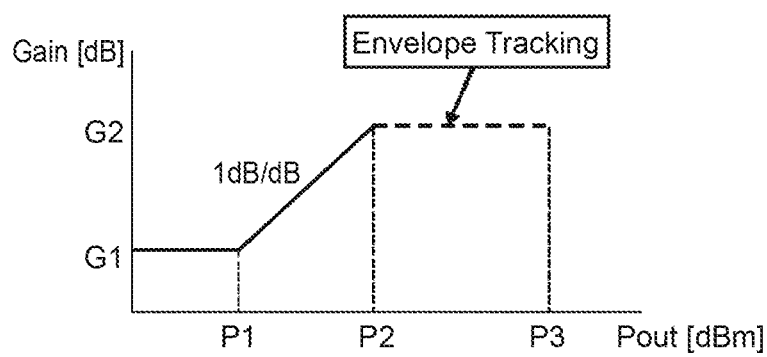
FIG. 2A is an explanatory diagram illustrating an operation example of a source voltage control circuit and a bias control circuit illustrated in FIG. 1.
Figure 2B:
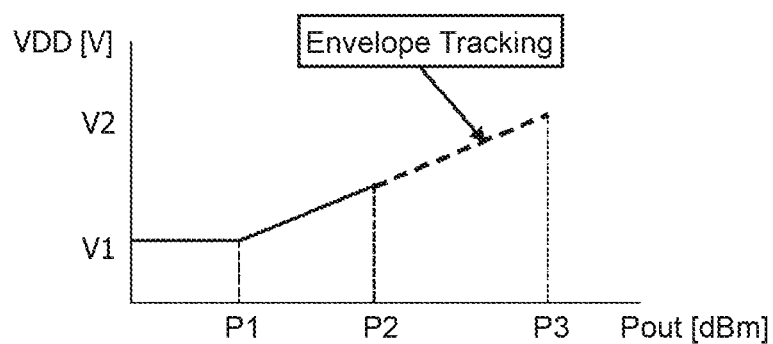
FIG. 2B is an explanatory diagram illustrating an operation example of the source voltage control circuit and the bias control circuit illustrated in FIG. 1.
Figure 2C:
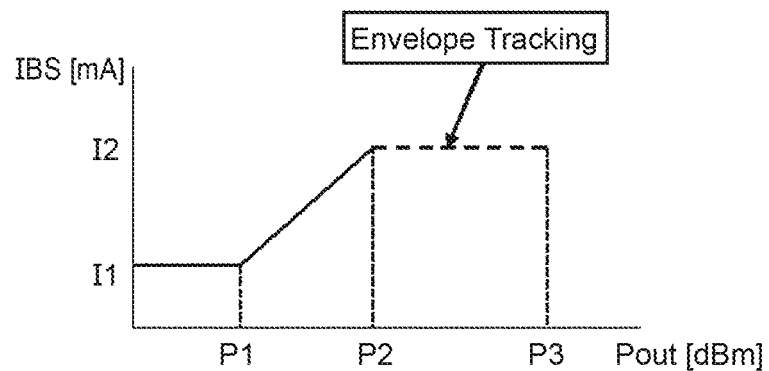
FIG. 2C is an explanatory diagram illustrating an operation example of the source voltage control circuit and the bias control circuit illustrated in FIG. 1.

FIGS. 2A to 2C are explanatory diagrams illustrating an operation example of the source voltage control circuit and the bias control circuit illustrated in FIG. 1. FIG. 2A illustrates a relationship between the output power level of the high-frequency power amplifier HPA and the gain, FIG. 2B illustrates a relationship between the output power level of the high-frequency power amplifier HPA and the source voltage VDD, and FIG. 2C illustrates a relationship between the output power level of the high-frequency power amplifier HPA and a bias current IBS. As illustrated in FIGS. 2A to 2C, when the output power level is equal to or greater than P2 (for example, 15 dBm), the wireless communication apparatus illustrated in FIG. 1 performs an operation using an envelope tracking system. This operation mode is referred to as an envelope tracking mode in this embodiment.

Figure 11A:
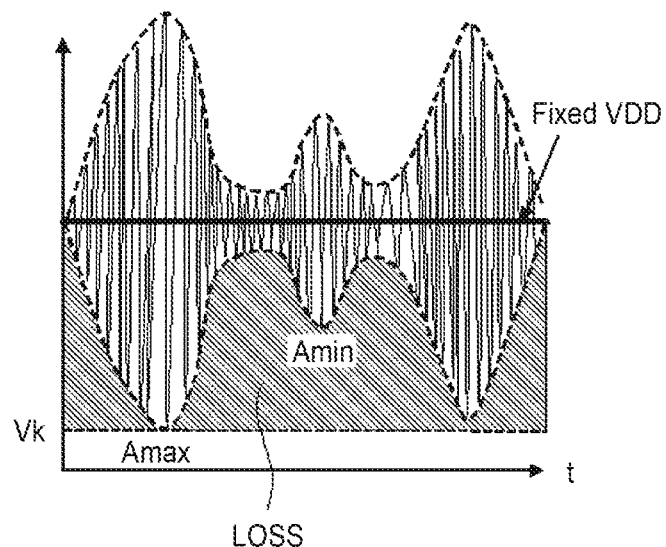
FIG. 11A is an explanatory diagram illustrating an operation example of a linear mode.
Figure 11B:
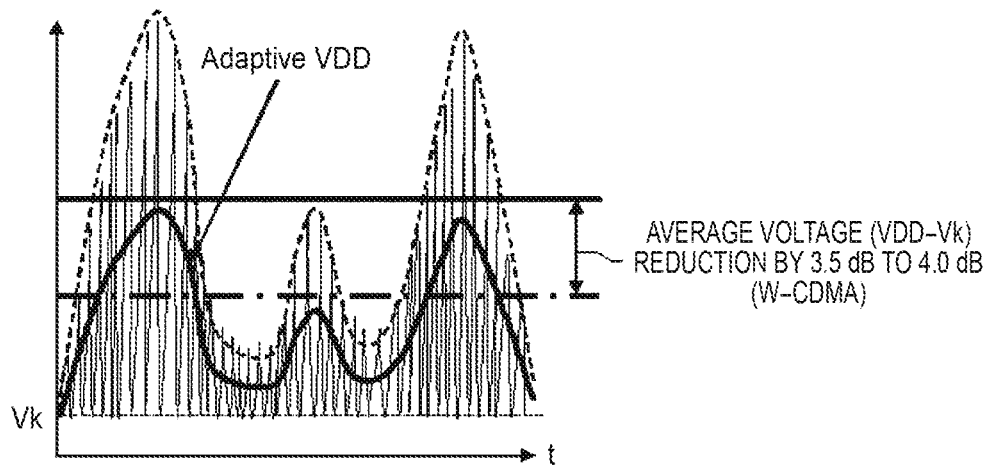
FIG. 11B is an explanatory diagram illustrating an operation example of the envelope tracking mode in FIG. 10.

Specifically, when recognizing that an output power level (average power) set by the high-frequency power amplifier HPA is equal to or greater than P2 with reference to the output power control signal PWCS, the source voltage control circuit VDCTL illustrated in FIG. 1 generates a source voltage control signal VDCS reflecting the output power level (average power) in an envelope, for example, based on the amplitude control signal AMCS. That is, the average value of the source voltage is determined, for example, depending on the output power level (average power), and the source voltage control signal VDCS for causing the source voltage to vary with a predetermined amplitude with respect to the average value so as to track the envelope based on the amplitude control signal AMCS that is generated. The high-speed DC-DC converter DCDC receives the source voltage control signal VDCS and generates the source voltage VDD as illustrated in FIG. 11B.

When recognizing that the output power level (average power) set by the high-frequency power amplifier HPA is equal to or greater than P2 with reference to the output power control signal PWCS, the bias control circuit BSCTL illustrated in FIG. 1 generates the bias control signal BSCS for fixing a bias current IBS to a predetermined current value I2 (for example, 2 mA) as illustrated in FIG. 2C. When the bias current IBS varies in the envelope tracking mode, the gain of the high-frequency power amplifier HPA may vary greatly and it may be difficult to accurately control the amplitude using the source voltage. Accordingly, the bias current is normally fixed in the envelope tracking mode. The gain G2 of the high-frequency power amplifier HPA in the envelope tracking mode can be, for example, 25 dB and the maximum output power level P3 set by the high-frequency power amplifier HPA can be, for example, 27 dBm. The implementation method of the envelope tracking mode is not particularly limited to this configuration.

In contrast, when the output power level is in a range of P2 (for example, 15 dBm) to P1 (for example, 5 dBm) as illustrated in FIGS. 2A to 2C, the wireless communication apparatus illustrated in FIG. 1 performs an operation using a variable control system of the source voltage and the bias without using the envelope tracking system. This operation mode is referred to as a variable control mode in this embodiment. In the variable control mode, the wireless communication apparatus illustrated in FIG. 1 decreases the gain of the high-frequency power amplifier HPA from G2 (for example, 25 dB) in the envelope tracking mode to G1 (for example, 15 dB), for example, at a ratio of 1 dB/dB depending on the value of the output power level as illustrated in FIG. 2A.

Specifically, when recognizing that the output power level (average power) set by the high-frequency power amplifier HPA is in a range of P2 to P1 with reference to the output power control signal PWCS, the source voltage control circuit VDCTL illustrated in FIG. 1 generates the source voltage control signal VDCS for monotonously decreasing the source voltage VDD in proportion to a decrease of the output power level as illustrated in FIG. 2B. The source voltage VDD appropriately transitions depending on the output amplitude (instantaneous power) in the envelope tracking mode, but may be a fixed voltage in the variable control mode. Here, the value of this fixed voltage is variably controlled so as to gradually decrease to V1 (for example, 0.5 V) in proportion to a decrease of the output power level from P2 to P1 with the average source voltage of the source voltage VDD at the output power level P2 as a start point in the envelope tracking mode. A maximum value V2 of the source voltage VDD in the envelope tracking mode can be, for example, 3.4 V.

Similarly, when recognizing that the output power level (average power) set by the high-frequency power amplifier HPA is in a range of P2 to P1 with reference to the output power control signal PWCS, the bias control circuit BSCTL illustrated in FIG. 1 generates the bias control signal BSCS for monotonously decreasing the bias current IBS in proportion to the decrease of the output power level as illustrated in FIG. 2C. The bias current IBS is a fixed current not depending on the output power level in the envelope tracking mode, but is variably controlled so as to gradually decrease from I2 (for example, 2 mA) to I1 (a predetermined value based on the gain of the high-frequency power amplifier HPA) in proportion to a decrease of the output power level from P2 (for example, 15 dBm) to P1 (for example, 5 dBm) in the variable control mode.

When the output power level is smaller than P1 (for example, 5 dBm) as illustrated in FIGS. 2A to 2C, the wireless communication apparatus illustrated in FIG. 1 performs an operation in which the source voltage and the bias are fixed without using the envelope tracking mode and the variable control mode. This operation mode is referred to as a fixed control mode in this embodiment. Specifically, when recognizing that the output power level (average power) set by the high-frequency power amplifier HPA is smaller than P1 with reference to the output power control signal PWCS, the source voltage control circuit VDCTL illustrated in FIG. 1 generates the source voltage control signal VDCS for fixing the source voltage VDD to V1 regardless of the output power level as illustrated in FIG. 2B. Similarly, when recognizing that the output power level (average power) set by the high-frequency power amplifier HPA is smaller than P1 with reference to the output power control signal PWCS, the bias control circuit BSCTL illustrated in FIG. 1 generates the bias control signal BSCS for fixing the bias current IBS to I1 regardless of the output power level as illustrated in FIG. 2C. The value of V1 or I1 depends on performance of a transistor and is appropriately determined depending on a limit value (such as a knee voltage) in performance in which a linear amplification operation is possible.

In these configurations and operations, as described above, when the average output power (Pout) is not greater than a predetermined reference level (P2 (for example, 15 dBm) in FIG. 2), a satisfactory power saving effect or the like may not be achieved due to power consumption or accuracy of the high-speed DC-DC converter DCDC in the envelope tracking mode. Therefore, this embodiment includes the variable control mode as described with reference to FIG. 2 and the source voltage VDD and the bias current IBS are decreased with a decrease of the average output power (Pout) when the average output power (Pout) is equal to or less than a predetermined reference level (P2 (for example, 15 dBm) in FIG. 2).

Figure 9:
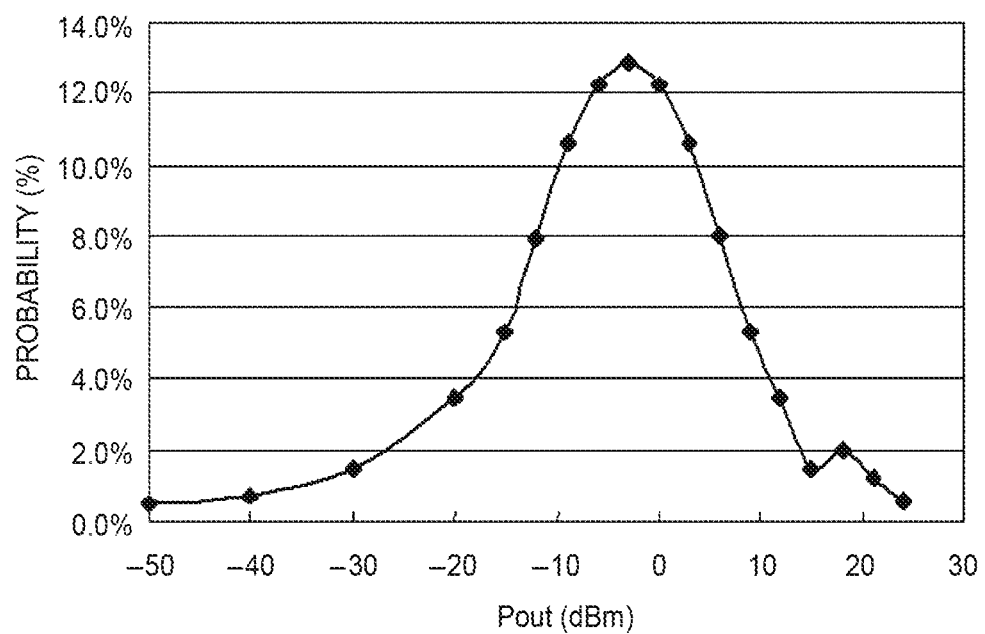
FIG. 9 is a diagram illustrating an example of a probability distribution of frequency of use of output power levels in a mobile phone for W-CDMA.

When the average output power (Pout) gradually decreases, the high-frequency power amplifier HPA can be made to perform a linear amplification operation without any problem even by gradually decreasing the source voltage VDD to correspond thereto, thereby reducing the power consumption of the high-frequency power amplifier HPA. When the average output power (Pout) gradually decreases, the bias current IBS (that is, the gain of the high-frequency power amplifier HPA) can be made to gradually decrease to correspond thereto, thereby reducing the power consumption of the high-frequency power amplifier HPA. As a result, for example, as illustrated in FIG. 9, it is possible to reduce the power consumption particularly from the low power level to the intermediate power level (−15 dBm to +15 dBm) of which the probability of actual use is high, thereby achieving a decrease in power consumption of a mobile phone as a whole.

By gradually decreasing the bias current IBS, it is possible to easily guarantee a dynamic range of the average output power (Pout). That is, for example, in case of W-CDMA, the average output power (Pout) should have a dynamic range of about 80 dB as illustrated in FIG. 9. When the gain of the high-frequency power amplifier HPA is fixed, a variable gain amplifying circuit (VDRV in FIG. 5 to be described later) disposed in the front stage of the high-frequency power amplifier HPA should have the dynamic range of about 80 dB. In this case, it may be difficult to design the variable gain amplifying circuit. Therefore, when the gain of the high-frequency power amplifier HPA decreases, it is possible to narrow the dynamic range of the variable gain amplifying circuit by as much, thereby achieving easy design or the like.

Schematic Operation of Principal Parts of Wireless Communication Apparatus (Modification Example [1]

Figure 3:
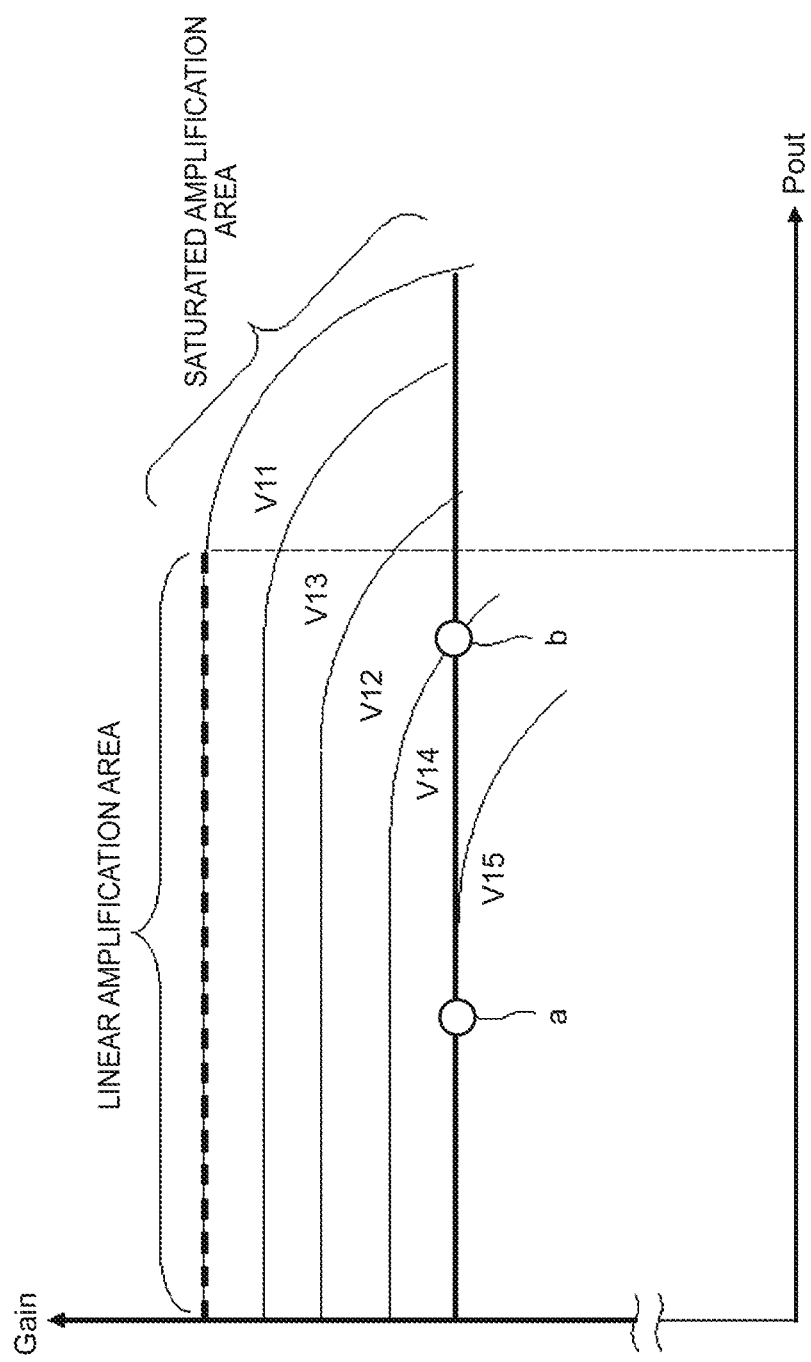
FIG. 3 is an explanatory diagram illustrating an example of an operating situation of a high-frequency power amplifier in an envelope tracking mode illustrated in FIG. 1 and FIGS. 2A to 2C.
Figure 12:
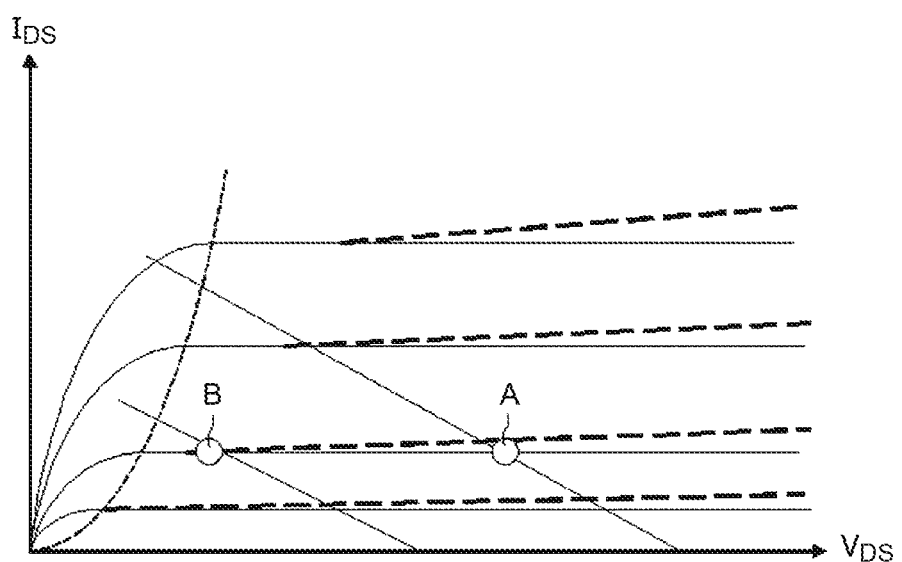
FIG. 12 is an explanatory diagram illustrating an example of electrical characteristics of a high-frequency power amplifier.

FIG. 3 is an explanatory diagram illustrating an example of an operating situation of the high-frequency power amplifier in the envelope tracking mode illustrated in FIG. 1 and FIGS. 2A to 2C. FIG. 12 is an explanatory diagram illustrating an example of electrical characteristics of the high-frequency power amplifier. When the source voltage VDD of the high-frequency power amplifier HPA gradually decreases from V11 to V15 as illustrated in FIG. 3, a linear amplification area (area in which the gain is constant) with respect to the output power level (Pout) is gradually narrowed and the gain actually gradually decreases. This is because the characteristics of the high-frequency power amplifier (transistor) have source voltage dependency as illustrated in FIG. 12. The source voltage dependency results from a so-called channel length modulation effect, for example, in a MOS transistor, and results from parasitic capacity between the base and the collector in a bipolar transistor. In FIG. 12, when the source voltage (source-drain voltage $V_{DS}$) varies, an operating point varies, for example, as indicated by point "A" and point "B" and the output impedance of the transistor varies, whereby the gain varies in this way. Although not illustrated in the drawing, the smaller the source voltage becomes the smaller the variation of the gain becomes.

The envelope tracking operation is implemented by appropriately changing the source voltage VDD so that the operation area is a linear amplification area as close as possible to a saturated amplification operation area depending on the output amplitude level (instantaneous power) of the high-frequency power amplifier HPA, for example, between point "a" and point "b" in FIG. 3.

Figure 4A:
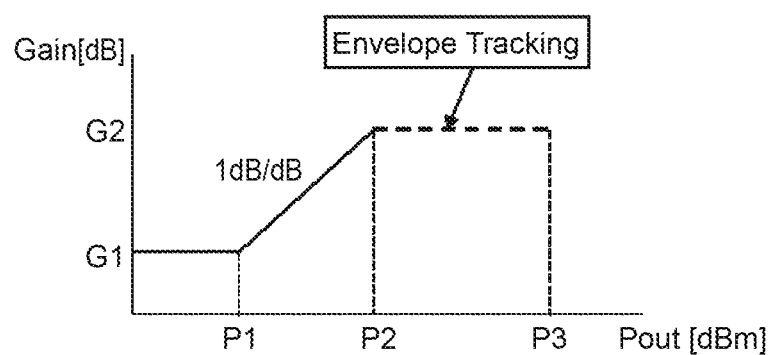
FIG. 4A is an explanatory diagram illustrating another operation example of the source voltage control circuit and the bias control circuit illustrated in FIG. 1.
Figure 4B:
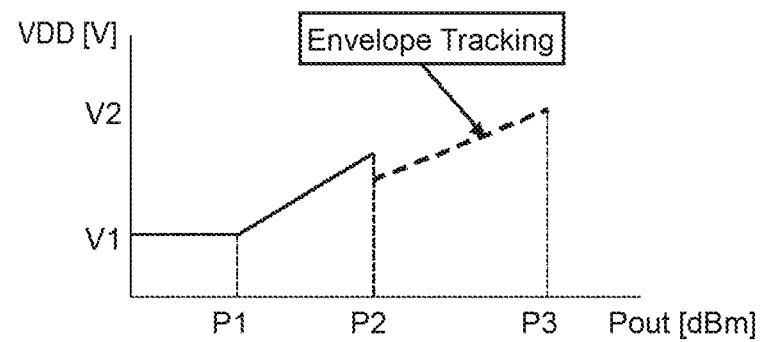
FIG. 4B is an explanatory diagram illustrating another operation example of the source voltage control circuit and the bias control circuit illustrated in FIG. 1.
Figure 4C:
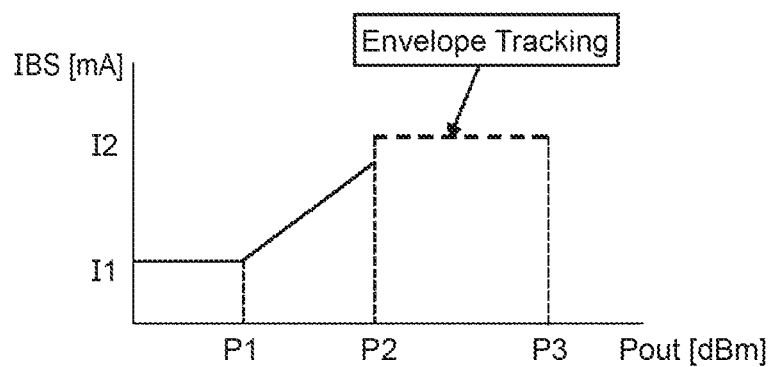
FIG. 4C is an explanatory diagram illustrating another operation example of the source voltage control circuit and the bias control circuit illustrated in FIG. 1.

FIGS. 4A to 4C are explanatory diagrams illustrating another operation example of the source voltage control circuit and the bias control circuit illustrated in FIG. 1, and show a modification example of FIGS. 2A to 2C. The operation example illustrated in FIGS. 4A to 4C is different from the operation example illustrated in FIGS. 2A to 2C, in that when the operation mode is changed from the envelope tracking mode to the variable control mode, the start point of the source voltage VDD is set to be slightly higher as illustrated in FIG. 4B and the start point of the bias current IBS is set to slightly lower as illustrated in FIG. 4C. The change from the envelope tracking mode to the variable control mode in the operation example illustrated in FIGS. 2A to 2C corresponds to, for example, point "a" in FIG. 3, and the change from the envelope tracking mode to the variable control mode in the operation example illustrated in FIGS. 4A to 4C corresponds to, for example, point "b" in FIG. 3.

In point "a" in FIG. 3, since the average output power level (Pout) is small, the variation of the source voltage due to the envelope tracking mode is relatively small and the gain variation corresponding thereto is very small. When the envelope tracking mode is stopped in this state, it is possible to satisfactorily guarantee the linear amplification operation using even the average value of the source voltage at the time point of stop. Accordingly, as illustrated in FIGS. 2A to 2C, it is possible to continuously control the gain of the high-frequency power amplifier HPA by continuously performing an operation based on the variable control mode with the average value of the source voltage and the value of the bias current at the time point of stop as a start point.

On the other hand, in point "b" in FIG. 3, the variation of the source voltage based on the envelope tracking mode is relatively large and the variation of the gain corresponding thereto occurs to a certain degree. When the envelope tracking mode is stopped in this state, it can be considered that the source voltage is preferably set to be slightly higher than the average value of the source voltage at the time point at which the envelope tracking mode is stopped in order to guarantee the linear amplification operation without using the envelope tracking mode. Then, since the gain of the high-frequency power amplifier HPA is set to be slightly higher, the bias current IBS should be slightly decreased in order to return the increment to the original value. Accordingly, as start points as illustrated in FIGS. 4A to 4C, it is possible to continuously control the gain of the high-frequency power amplifier HPA by performing an operation based on the variable control mode with the state where the source voltage VDD is set to be slightly higher and the state where the bias current IBS is set to be slightly lower.

<Schematic Configuration and Operation of Whole Wireless Communication Apparatus>

Figure 5:
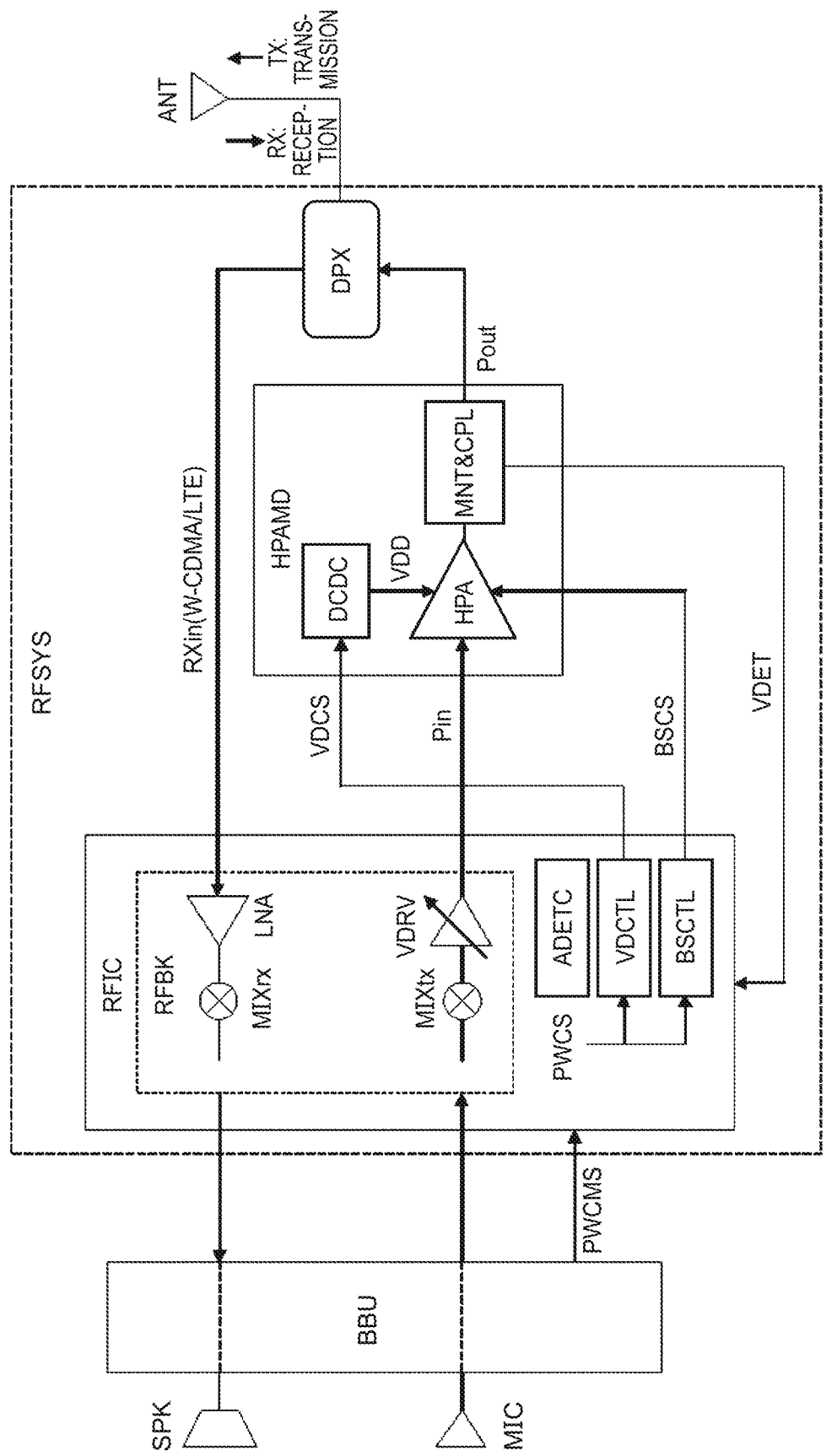
FIG. 5 is a block diagram illustrating a schematic configuration example of the whole wireless communication apparatus according to Embodiment 1 of the present invention.

FIG. 5 is a block diagram illustrating a schematic configuration example of the whole wireless communication apparatus according to Embodiment 1 of the present invention. The wireless communication apparatus illustrated in FIG. 5 is, for example, a mobile phone for W-CDMA or LTE (Long Term Evolution) and includes a baseband unit BBU, a high-frequency system unit RFSYS, an antenna ANT, a speaker SPK, and a microphone MIC. The baseband unit BBU converts an analog signal used in the speaker SPK or the microphone MIC into a digital signal, performs various digital signal processes (such as modulation, demodulation, and digital filter processing) based on communications, or outputs various control signals based on communications. The control signals include an output power indication signal PWCMS serving as a basis of the output power control signal PWCS illustrated in FIG. 1.

The high-frequency system unit RFSYS includes a high-frequency signal processing apparatus RFIC, a high-frequency power amplifier module HPAMD, and a duplexer DPX. The high-frequency signal processing apparatus RFIC is embodied, for example, by a single semiconductor chip and includes the high-frequency signal processing unit RFBK, the amplitude detecting circuit (envelope detecting circuit) ADETC, the source voltage control circuit VDCTL, and the bias control circuit BSCTL illustrated in FIG. 1. The high-frequency signal processing unit RFBK performs frequency conversion (up-conversion and down-conversion) between a baseband signal used in the baseband unit BBU and a high-frequency signal mainly used in the high-frequency power amplifier module HPAMD. The high-frequency signal processing unit RFBK, for example, includes a transmitting mixer circuit MIXtx and/or a variable driver circuit VDRV as transmission system circuits, and includes a low noise amplification circuit LNA and/or a receiving mixer circuit MIXrx as reception system circuits.

The high-frequency power amplifier module HPAMD is embodied, for example, by a single module printed board (for example, a ceramic printed board) and includes an output matching circuit MNT and a directional coupler (coupler) CPL in addition to the high-frequency power amplifier HPA and the high-speed DC-DC converter DCDC illustrated in FIG. 1. The high-frequency power amplifier HPA and the high-speed DC-DC converter DCDC are embodied, for example, by the same semiconductor chip or different semiconductor chips and are mounted on the module printed board. The output matching circuit MNT and the directional coupler CPL are formed, for example, using interconnection layers or surface mount device (SMD) components on the module printed board. The output matching circuit MNT matches the output impedance of the high-frequency power amplifier HPA, the directional coupler CPL detects the output power signal Pout of the high-frequency power amplifier HPA and generates a detected voltage signal VDET having a voltage value corresponding to the detected power level. The duplexer DPX separates a transmission signal and a reception signal on the basis of a predetermined transmission/reception frequency band.

In this configuration example, at the time of a transmitting operation, a transmission baseband signal from the baseband unit BBU is up-converted by the mixer circuit MIXtx and is amplified by the variable driver circuit (variable gain amplifying circuit) VDRV. The gain of the variable driver circuit VDRV is determined depending on the output power indication signal PWCMS from the baseband unit BBU or the detected voltage signal VDET from the coupler CPL. As described with reference to FIG. 1 and FIGS. 2A to 2C, the high-frequency power amplifier HPA operates using the source voltage VDD from the high-speed DC-DC converter DCDC and the bias based on the bias control signal BSCS from the bias control circuit BSCTL to amplify the power of the input power signal Pin from the variable driver circuit VDRV. Then, the output power signal Pout from the high-frequency power amplifier HPA is transmitted as a transmission signal TX from the antenna ANT via the output matching circuit MNT, the coupler CPL, and the duplexer DPX. On the other hand, at the time of a receiving operation, a reception signal RX received from the antenna ANT is output as a received input signal RXin to the low noise amplification circuit LNA via the duplexer DPX. The low noise amplification circuit LNA amplifies the received input signal RXin and the mixer circuit MIXrx down-converts the output signal of the low noise amplification circuit LNA into a received baseband signal and outputs the baseband signal to the baseband unit BBU.

Particularly, since modulation methods such as hybrid phase shift keying (HPSK) and quadrature amplitude modulation (QAM) having an envelope variation are used in a mobile phone for W-CDMA or LTE, a linear amplification operation is preferred at the time of transmission. A decrease in power consumption is additionally preferred. Accordingly, as described with reference to FIGS. 1, 2A to 2C, and 4A to 4C, a power control system in which the envelope tracking mode and the variable control mode are combined is usefully used.

<Details of Principal Parts of Wireless Communication Apparatus>

Figure 6:
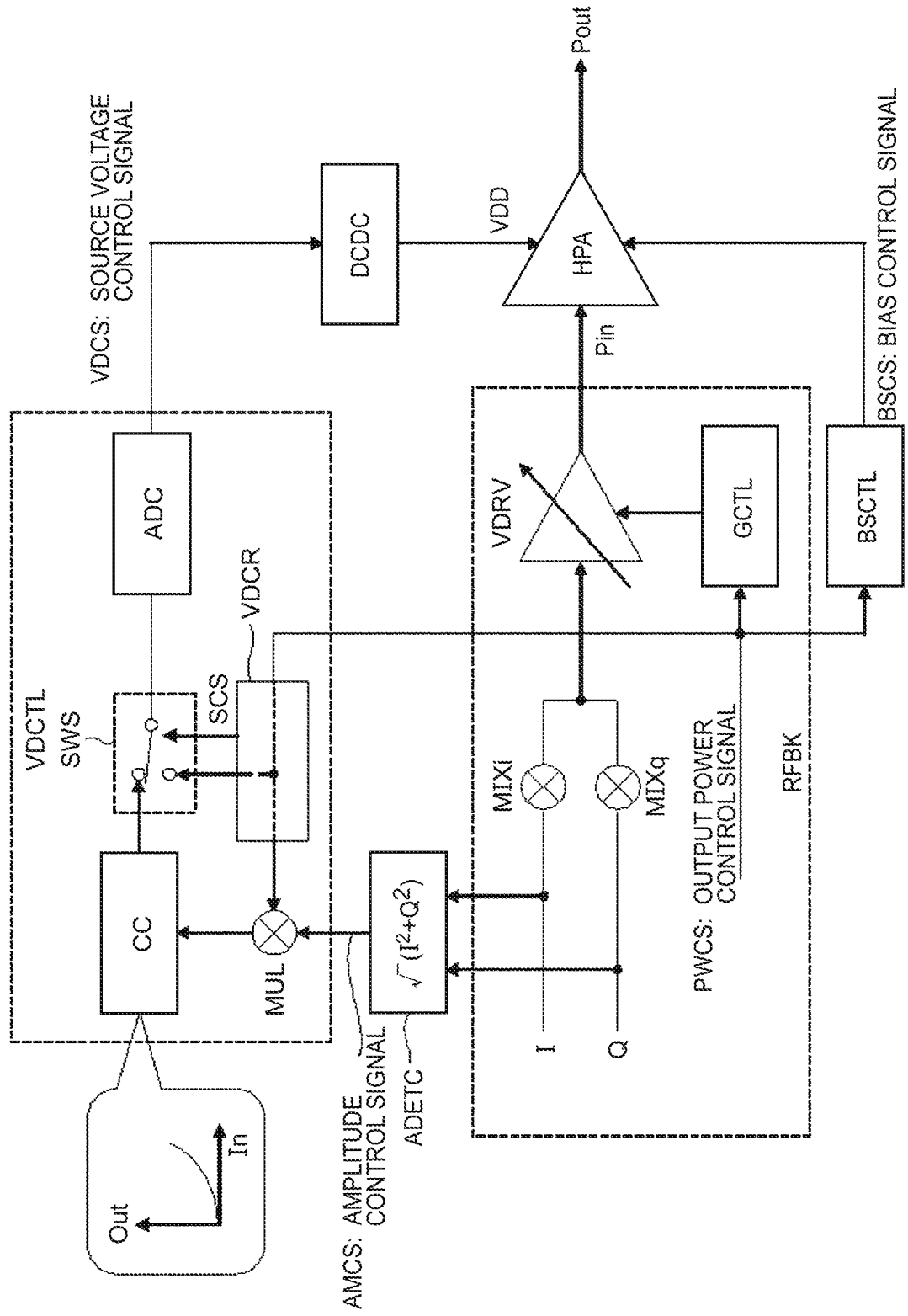
FIG. 6 is a circuit block diagram illustrating a detailed configuration example of the wireless communication apparatus illustrated in FIG. 1 and FIGS. 2A to 2C.

FIG. 6 is a circuit block diagram illustrating a detailed configuration example of the wireless communication apparatus illustrated in FIG. 1 and FIGS. 2A to 2C. In FIG. 6, the high-frequency signal processing unit RFBK includes mixer circuits MIXi and MIXq, a variable driver circuit VDRV, and a gain control circuit GCTL. The mixer circuit MIXi up-converts an I signal which is one of the orthogonal components of the baseband signal into a local signal (not illustrated) having a predetermined frequency and the mixer circuit MIXq up-converts a Q signal which is the other of the orthogonal components into a local signal (not illustrated) having a phase 90° different from the I signal. The variable driver circuit VDRV receives the vector combination result of the output of the mixer circuit MIXi and the output of the mixer circuit MIXq and amplifies the vector combination result with a predetermined gain. The gain control circuit GCTL receives the output power control signal PWCS indicating an indicated value of the average output power level and sets a gain corresponding thereto to the variable driver circuit VDRV. The gain control circuit GCTL actually sets the gain in consideration of the detected voltage signal VDET illustrated in FIG. 5.

The amplitude detecting circuit (envelope detecting circuit) ADETC outputs an amplitude control signal (envelope detection signal) AMCS by calculating the magnitude ($\sqrt{(I^2+Q^2)}$) of the vector sum of the I signal and the Q signal. The source voltage control circuit VDCTL includes a multiplication circuit MUL, a correction circuit CC, a selection switch SWS, a control core circuit VDCR, and an analog-digital conversion circuit ADC. The multiplication circuit MUL scalar-multiplies the amplitude control signal AMCS indicating an envelope by the output power control signal PWCS indicating the average output power level. The correction circuit CC corrects the output of the multiplication circuit MUL, for example, on the basis of a predetermined table. This correction is mainly performed from the point of view of reducing the source voltage dependency of the gain by a certain degree while maintaining the linear amplification operation in the high-frequency power amplifier HPA. The selection switch SWS selects one of the output signal of the correction circuit CC and the output signal of the control core circuit VDCR and outputs the selected signal to the analog-digital conversion circuit ADC.

As described with reference to FIG. 1 and FIGS. 2A to 2C, the control core circuit VDCR receives the output power control signal PWCS and selects one of the envelope tracking mode, the variation control mode, and the fixed control mode depending on the average output power level indicated by the received signal. When the envelope tracking mode is selected, the control core circuit VDCR sets the selection switch SWS to the correction circuit CC side using the switch selection signal SCS. On the other hand, when the variable control mode or the fixed control mode is selected, the control core circuit VDCR sets the selection switch SWS to its own side using the switch selection signal SCS. In this state, the control core circuit VDCR supplies the average output power level indicated by the output power control signal PWCS as an input of the selection switch SWS when the variable control mode is selected, and supplies the level corresponding to V1 in FIG. 2B as an input of the selection switch SWS when the fixed control mode is selected. The analog-digital conversion circuit ADC converts the analog signal output from the selection switch SWS into a digital signal and outputs the conversion result as the source voltage control signal VDCS.

The high-speed DC-DC converter DCDC generates the source voltage VDD based on the source voltage control signal VDCS and supplies the generated source voltage to the high-frequency power amplifier HPA. As described with reference to FIG. 1 and FIGS. 2A to 2C, the bias control circuit BSCTL receives the output power control signal PWCS, selects one of the envelope tracking mode, the variable control mode, and the fixed control mode depending on the average output power level indicated by the received signal, and outputs the bias control signal BSCS corresponding to the selected mode. The high-frequency power amplifier HPA power-amplifies the input power signal Pin output from the variable driver circuit VDRV under a bias (bias current or bias voltage) condition based on the source voltage VDD supplied from the high-speed DC-DC converter DCDC and the bias control signal BSCS and outputs the output power signal Pout.

By employing this configuration example, it is possible to implement the wireless communication apparatus illustrated in FIG. 1 and FIGS. 2A to 2C with a simple configuration. Particularly, by controlling the source voltage in the envelope tracking mode on the basis of the orthogonal baseband information and the information indicating the average output power level, the configuration for embodying the variable control mode and the fixed control mode can be simplified. The orthogonal baseband signals (I signal and Q signal) are not limited to analog signals and may be digital signals. The present invention is not limited to this configuration and, for example, a configuration in which an envelope is detected from the input power signal Pin instead of the baseband signal may be employed.

Embodiment 2

Schematic Operation of Principal Parts of Wireless Communication Apparatus (Modification Example [2]

Figure 7A:
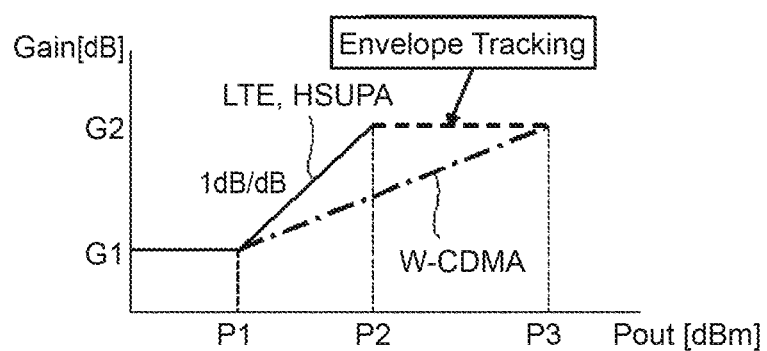
FIG. 7A is an explanatory diagram illustrating an operation example of the source voltage control circuit and the bias control circuit illustrated in FIG. 1 in a wireless communication apparatus according to Embodiment 2 of the present invention.
Figure 7B:
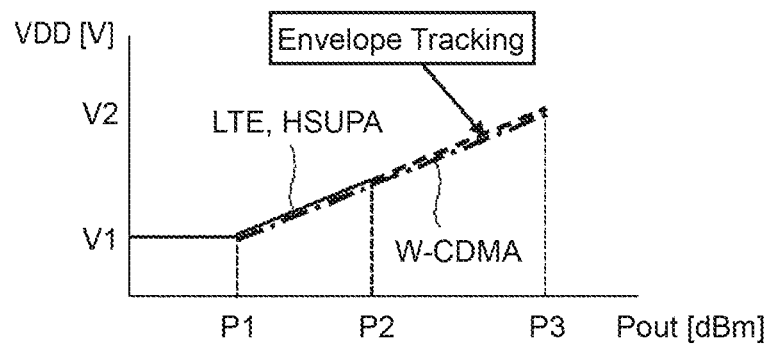
FIG. 7B is an explanatory diagram illustrating an operation example of the source voltage control circuit and the bias control circuit illustrated in FIG. 1 in the wireless communication apparatus according to Embodiment 2 of the present invention.
Figure 7C:
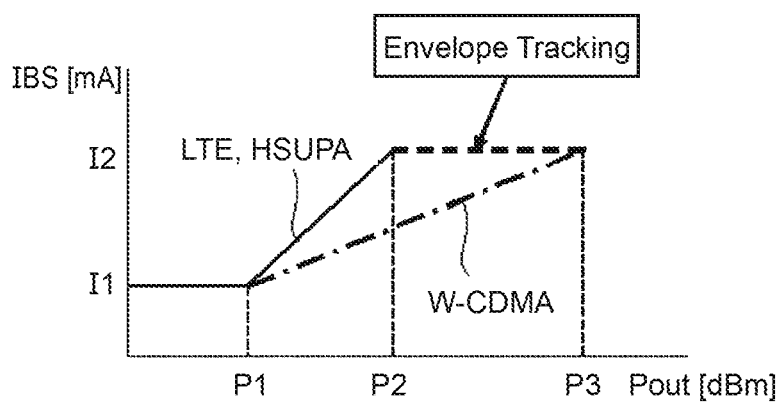
FIG. 7C is an explanatory diagram illustrating an operation example of the source voltage control circuit and the bias control circuit illustrated in FIG. 1 in the wireless communication apparatus according to Embodiment 2 of the present invention.

FIGS. 7A to 7C are explanatory diagrams illustrating an operation example of the source voltage control circuit and the bias control circuit illustrated in FIG. 1 in a wireless communication apparatus according to Embodiment 2 of the present invention and are a modification example of FIGS. 2A to 2C. The operation example illustrated in FIGS. 7A to 7C is the same as in FIGS. 2A to 2C at the time of LTE, high speed uplink packet access (HSUPA) which is a standard for raising a transmission rate of W-CDMA, or the like, but is different therefrom at the time of W-CDMA.

As illustrated in FIGS. 7A to 7C, when the output power level is equal to or greater than P1 (for example, 5 dBm) at the time of W-CDMA, the wireless communication apparatus illustrated in FIG. 1 operates using the variable control mode without using the envelope tracking mode. That is, when recognizing that the output power level (average power) set by the high-frequency power amplifier HPA is equal to or greater than P1 with reference to the output power control signal PWCS, the source voltage control circuit VDCTL illustrated in FIG. 1 generates the source voltage control signal VDCS for monotonously increasing the source voltage VDD in proportion to an increase of the output power level as illustrated in FIG. 7B. Similarly, when recognizing that the output power level (average power) set by the high-frequency power amplifier HPA is equal to or greater than P1 with reference to the output power control signal PWCS, the bias control circuit BSCTL illustrated in FIG. 1 generates the bias control signal BSCS for monotonously increasing the bias current IBS in proportion to the increase of the output power level as illustrated in FIG. 7C.

On the other hand, when the output power level is less than P1 (for example, 5 dBm) at the time of W-CDMA, the wireless communication apparatus illustrated in FIG. 1 operates using the fixed control mode as described with reference to FIGS. 2A to 2C. At the time of W-CDMA, the gain of the high-frequency power amplifier HPA monotonously increases from G1 (for example, 15 dB) to G2 (for example, 25 dB) in proportion to the increase of the output power level (average power) from P1 (for example, 5 dBm) to P3 (for example, 27 dBm) in the variable control mode.

In W-CDMA, since the variation of the signal amplitude (instantaneous power) is smaller than those in LTE or HSUPA due to a difference in modulation scheme, it may be considered that the decrease in power consumption of the high-frequency power amplifier HPA obtained through the envelope tracking is cancelled by the power consumption of the high-speed DC-DC converter DCDC and thus the effect of reducing power consumption as a whole is not obtained. In W-CDMA, since the use probability at the low to intermediate power levels is very high as illustrated in FIG. 9, even the use of the envelope tracking mode for reduction in power consumption at a high power level may not contribute much to the effect of reducing power consumption as a whole.

Therefore, when the variable control mode and the fixed control mode are combined for use in W-CDMA as illustrated in FIGS. 7A to 7C, the loss described with reference to FIG. 11A slightly increases but the power consumption of the high-speed DC-DC converter DCDC can be reduced, compared with the example illustrated in FIGS. 2A to 2C. As a result, it is possible to achieve a satisfactory effect of reducing power consumption as a whole.

Embodiment 3

Schematic Configuration of Principal Parts of Wireless Communication Apparatus (Modification Example)

Figure 8:
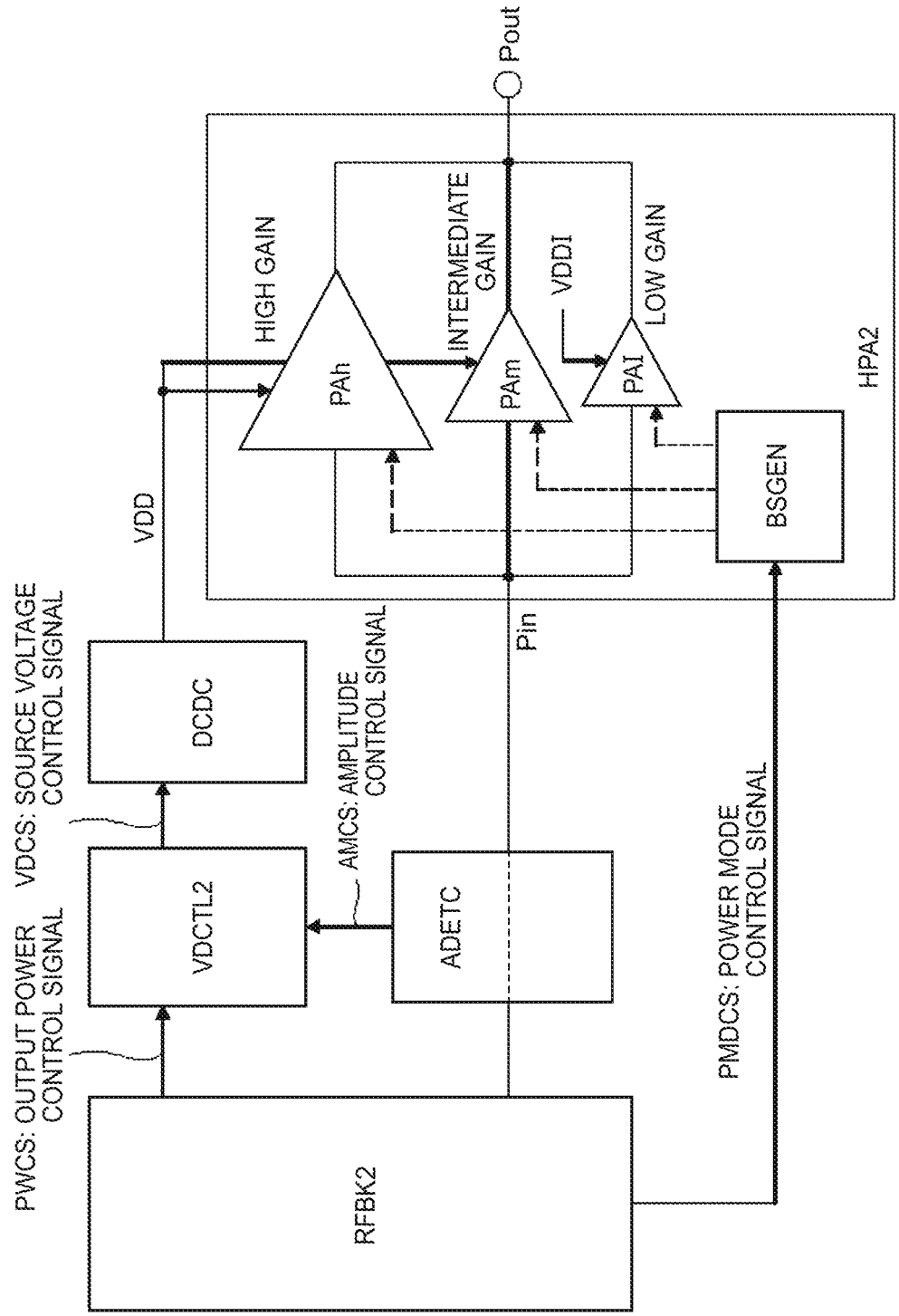
FIG. 8 is a block diagram illustrating a schematic configuration example of principal parts of a wireless communication apparatus according to Embodiment 3 of the present invention.

FIG. 8 is a block diagram illustrating a schematic configuration example of principal parts of a wireless communication apparatus according to Embodiment 3 of the present invention. The wireless communication apparatus illustrated in FIG. 8 includes a high-frequency signal processing unit RFBK2, an amplitude detecting circuit (envelope detecting circuit) ADETC, a source voltage control circuit VDCTL2, a high-speed DC-DC converter DCDC, and a high-frequency power amplifier HPA2. Among these, the amplitude detecting circuit ADETC and the high-speed DC-DC converter DCDC are the same as illustrated in FIG. 1. The high-frequency signal processing unit RFBK2 is different from the high-frequency signal processing unit RFBK illustrated in FIG. 1, in that it outputs a power mode control signal PMDCS.

The high-frequency power amplifier HPA2 includes a high-gain power amplifying circuit PAh, an intermediate-gain power amplifying circuit PAm, a low-gain power amplifying circuit PAl, and a bias generating circuit BSGEN, unlike the high-frequency power amplifier HPA illustrated in FIG. 1. The high-gain power amplifying circuit PAh, the intermediate-gain power amplifying circuit PAm, and the low-gain power amplifying circuit PAl receive an input power signal Pin from a common input node and output an output power signal Pout from a common output node. The sizes of the transistors constituting the high-gain power amplifying circuit PAh, the intermediate-gain power amplifying circuit PAm, and the low-gain power amplifying circuit PAl have a relationship of PAh>PAm>PAl. The bias generating circuit BSGEN receives a power mode control signal PMDCS from the high-frequency signal processing unit RFBK2, selects one of the high-gain power amplifying circuit PAh, the intermediate-gain power amplifying circuit PAm, and the low-gain power amplifying circuit PAl, and supplies a bias to the selected circuit. For example, when high power is indicated by the power mode control signal PMDCS, the bias generating circuit BSGEN supplies a predetermined bias to the high-gain power amplifying circuit PAh and stops the supply of a bias to the intermediate-gain power amplifying circuit PAm and the low-gain power amplifying circuit PAl (the bias current or the bias voltage is set to zero). Similarly, for example, when intermediate power or low power is indicated by the power mode control signal PMDCS, the bias generating circuit BSGEN supplies a predetermined bias to only the intermediate-gain power amplifying circuit PAm and the low-gain power amplifying circuit PAl.

The configuration example illustrated in FIG. 8 illustrates that the source voltage VDD based on the envelope tracking mode is supplied to the high-gain and intermediate-gain power amplifying circuits PAh and PAm via the high-speed DC-DC converter DCDC and a fixed source voltage VDD1 is supplied to the low-gain power amplifying circuit PAl. That is, in FIG. 1 and FIGS. 2A to 2C, the reduction in power consumption is achieved by switching three types of operation modes using a single power amplifying circuit. However, in the example illustrated in FIG. 8, the reduction in power consumption is achieved by providing plural power amplifying circuits having different sizes and performing the envelope tracking mode at intermediate and high power levels.

Accordingly, when the output power control signal PWCS is equal to or greater than a high power level (P11), unlike the source voltage control circuit VDCTL illustrated in FIG. 1, the source voltage control circuit VDCTL2 illustrated in FIG. 8 generates the source voltage control signal VDCS so as to supply the power amplifying circuit PAh with the source voltage VDD varying depending on the amplitude control signal AMCS with respect to the power level. At this time, the power amplifying circuit PAh is activated by the bias generating circuit BSGEN and performs an operation using the envelope tracking mode. Similarly, when the output power control signal PWCS is less than the high power level (P11) and equal to or greater than a middle power level (P12), the source voltage control circuit VDCTL2 generates the source voltage control signal VDCS so as to supply the power amplifying circuit PAm with the source voltage VDD varying depending on the amplitude control signal AMCS with respect to the power level. At this time, the power amplifying circuit PAm is activated by the bias generating circuit BSGEN and performs an operation using the envelope tracking mode.

On the other hand, when the power control signal PWCS is less than the intermediate power level (P12), the source voltage control circuit VDCTL2 stops the operation of the high-speed DC-DC converter DCDC (or fixes the source voltage to a predetermined source voltage VDD). At this time, the power amplifying circuit PAl is activated by the bias generating circuit BSGEN and the power amplifying circuit PAl performs a power amplifying operation using the fixed source voltage VDD1.

In this way, by appropriately changing the sizes of the operating transistors depending on the output power level, it is possible to reduce the power consumption. At this time, by employing the configuration in which the envelope tracking is performed at the time of intermediate and high power levels, it is possible to further reduce the power consumption. In the configuration example illustrated in FIG. 8, the detailed adjustment of the output power level is performed using the input power signal Pin (the variable driver circuit VDRV illustrated in FIG. 5).

While the present invention is specifically described above in conjunction with the embodiments, the present invention is not limited to the embodiments and can be modified in various forms without departing from the gist of the present invention.

For example, in the configuration example illustrated in FIG. 8, three power amplifying circuits are provided, but two power amplifying circuits may be provided and the envelope tracking mode may be applied to only the power amplifying circuit having the larger size. For example, the configuration example illustrated in FIG. 1 and the configuration example illustrated in FIG. 8 may be appropriately combined for use. Specifically, for example, the low-gain power amplifying circuit PAl may be removed in the configuration example illustrated in FIG. 8 and the intermediate-gain power amplifying circuit PAm may operate in three types of operation modes as illustrated in FIG. 1 and FIGS. 2A to 2C instead thereof to cope with the intermediate and low power levels, and the same operation as described with reference to FIG. 8 may be performed at the time of high power.

A mobile phone is exemplified above, but the present invention is not limited to the mobile phone and can be usefully applied to various wireless terminals which is driven by a battery or the like and which uses modulation schemes having an envelope variation.

REFERENCE SIGNS LIST

ADC: analog-digital conversion circuit
ADETC, ADETC': amplitude detecting circuit (envelope detecting circuit)
AMCS: amplitude control signal (envelope detection signal)
ANT: antenna
BBU: baseband unit
BSCS: bias control signal
BSCTL: bias control circuit
BSGEN: bias generating circuit
CC: correction circuit
CPL: directional coupler (coupler)
DCDC: high-speed DC-DC converter
DPX: duplexer
GCTL: gain control circuit
HPA/HPA2: high-frequency power amplifier
HPAMD: high-frequency power amplifier module
LNA: low noise amplification circuit
MIC: microphone
MIX: mixer circuit
MNT: output matching circuit
MUL: multiplication circuit
PA: power amplifying circuit
PMDCS: power mode control signal
PWCMS: output power indication signal
PWCS: output power control signal
Pin: input power signal
Pout: output power signal
RFBK/RBFK2: high-frequency signal processing unit
RFIC: high-frequency signal processing apparatus
RFSYS: high-frequency system unit
RX: reception signal
SCS: switch selection signal
SPK: speaker
SWS: selection switch
TX: transmission signal
VDCR: control core circuit
VDCS: source voltage control signal
VDCTL/VDCTL2: source voltage control circuit
VDD: source voltage
VDET: detected voltage signal
VDRV: variable driver circuit

What is claimed is:
1. A wireless communication apparatus comprising:
first and second power amplifying circuits coupled in parallel between an input node and an output node, each of the first and second power amplifying circuits having a transistor;
a source voltage generating circuit;
a bias supply circuit configured to supply a bias to the first and second power amplifying circuits; and
an envelope detecting circuit configured to detect an envelope of an input signal input to the input node,
wherein the source voltage generating circuit is configured to:
supply a first source voltage to a drain or a collector of the transistor of the first power amplifying circuit when the wireless communication apparatus is oper- ating in a first power mode, the first source voltage varying along the envelope detected by the envelope detecting circuit, and supply a second source voltage to a drain or a collector of the transistor of the second power amplifying circuit when the wireless communication apparatus is operating in a second power mode, the second source voltage varying in proportion to an average power level of an output signal at the output node, and the second power mode being a lower power mode than the first power mode, and wherein the bias supply circuit is configured to:
as a first operation, supply the bias to a gate or a base of the transistor of the first power amplifying circuit and not supply the bias to a gate or a base of the transistor of the second power amplifying circuit when the wireless communication apparatus is operating in the first power mode, and as a second operation, supply the bias to the gate or the base of the transistor of the second power amplifying circuit and not supply the bias to the gate or the base of the transistor of the first power amplifying circuit when the wireless communication apparatus is operating in the second power mode.

2. The wireless communication apparatus according to claim 1, wherein the source voltage generating circuit is further configured to:
generate the first source voltage when an output power control signal indicates that the wireless communication apparatus is operating at a first power level, and
generate the second source voltage when the output power control signal indicates that the wireless communication apparatus is operating at a second power level, the second power level being a higher power level than the first power level.

3. The wireless communication apparatus according to claim 2, wherein the bias supply circuit is further configured to:
perform the first operation when a power mode control signal indicates that the wireless communication apparatus is operating in the first power mode, and
perform the second operation when the power mode control signal indicates that the wireless communication apparatus is operating in the second power mode.

4. The wireless communication apparatus according to claim 1, wherein the bias supply circuit is further configured to:
perform the first operation when a power mode control signal indicates that the wireless communication apparatus is operating in the first power mode, and
perform the second operation when the power mode control signal indicates that the wireless communication apparatus is operating in the second power mode.

5. A power amplifier module comprising:
first and second power amplifying circuits coupled in parallel between an input node and an output node, each of the first and second power amplifying circuits having a transistor; and
a bias supply circuit configured to supply a bias to the first and second power amplifying circuits,
wherein the first power amplifying circuit is configured to receive a first source voltage through a drain or a collector of the transistor of the first power amplifying circuit when the power amplifier module is operating in a first power mode, the first source voltage being time variable and correlated with an envelope signal of an input signal at the input node,
wherein the second power amplifying circuit is configured to receive a second source voltage through a drain or a collector of the transistor of the second power amplifying circuit when the power amplifier module is operating in a second power mode, the second source voltage varying in proportion to an average power level of an output signal at the output node, and the second power mode being a lower power mode than the first power mode, and
wherein the bias supply circuit is configured to:
as a first operation, supply the bias to a gate or a base of the transistor of the first power amplifying circuit and not supply the bias to a gate or a base of the transistor of the second power amplifying circuit when the power amplifier module is operating in the first power mode, and
as a second operation, supply the bias to the gate or the base of the transistor of the second power amplifying circuit and not supply the bias to the gate or the base of the transistor of the first power amplifying circuit when the power amplifier module is operating in the second power mode.

* * * * *